United States Patent
Aisenbrey

(10) Patent No.: US 7,164,388 B2
(45) Date of Patent: Jan. 16, 2007

(54) LOW COST ADJUSTABLE RF RESONATOR DEVICES MANUFACTURED FROM CONDUCTIVE LOADED RESIN-BASED MATERIALS

(75) Inventor: Thomas Aisenbrey, Littleton, CO (US)

(73) Assignee: Integral Technologies, Inc., Bellingham, WA (US)

(*) Notice: Subject to any disclaimer, the term of this patent is extended or adjusted under 35 U.S.C. 154(b) by 127 days.

(21) Appl. No.: 10/827,061

(22) Filed: Apr. 19, 2004

(65) Prior Publication Data
US 2004/0196198 A1  Oct. 7, 2004

Related U.S. Application Data

(63) Continuation-in-part of application No. 10/309,429, filed on Dec. 4, 2002, now Pat. No. 6,870,516, which is a continuation-in-part of application No. 10/075,778, filed on Feb. 14, 2002, now Pat. No. 6,741,221.

(60) Provisional application No. 60/478,774, filed on Jun. 16, 2003, provisional application No. 60/461,877, filed on Apr. 10, 2003, provisional application No. 60/317,808, filed on Sep. 7, 2001, provisional application No. 60/269,414, filed on Feb. 16, 2001, provisional application No. 60/268,822, filed on Feb. 15, 2001.

(51) Int. Cl.
H01Q 9/00 (2006.01)

(52) U.S. Cl. ............... 343/745; 331/59; 331/117 R

(58) Field of Classification Search ............... 343/795, 343/745, 873, 820, 895, 787, 718; 331/59, 331/117 R; 524/495–496
See application file for complete search history.

(56) References Cited

U.S. PATENT DOCUMENTS 4,267,480 A  5/1981  Kanematsu et al. ........ 310/366

(Continued)

FOREIGN PATENT DOCUMENTS

GB  2377449 A  1/2003

OTHER PUBLICATIONS

Cleland et al., "Fabrication of high frequency nanometer scale mechanical resonators from bulk Si crystals", Applied Physics Letter 69(18), Oct. 28, 1996, pp. 2653-2655.

*Primary Examiner*—Hoang V. Nguyen
*Assistant Examiner*—Chuc Tran
(74) *Attorney, Agent, or Firm*—Douglas R. Schnabel

(57) ABSTRACT

Inductor-capacitor (LC) RF resonator circuits are formed of a conductive loaded resin-based material. The conductive loaded resin-based material comprises micron conductive powder(s), conductive fiber(s), or a combination of conductive powder and conductive fibers in a base resin host. The ratio of the weight of the conductive powder(s), conductive fiber(s), or a combination of conductive powder and conductive fibers to the weight of the base resin host is between about 0.20 and 0.40. The micron conductive powders are formed from non-metals, such as carbon, graphite, that may also be metallic plated, or the like, or from metals such as stainless steel, nickel, copper, silver, that may also be metallic plated, or the like, or from a combination of non-metal, plated, or in combination with, metal powders. The micron conductor fibers preferably are of nickel plated carbon fiber, stainless steel fiber, copper fiber, silver fiber, or the like. The conductive loaded resin-based inductor-capacitor (LC) RF resonator circuits can be formed using methods such as injection molding compression molding or extrusion. The conductive loaded resin-based material used to form the inductor-capacitor (LC) RF resonator circuits can also be in the form of a thin flexible woven fabric that can readily be cut to the desired shape.

66 Claims, 9 Drawing Sheets

U.S. PATENT DOCUMENTS

| | | | |
|---|---|---|---|
| 4,786,837 A | 11/1988 | Kalnin et al. | 310/364 |
| 4,876,140 A * | 10/1989 | Quackenbush | 428/216 |
| 6,111,343 A | 8/2000 | Unami et al. | 310/366 |
| 6,127,474 A * | 10/2000 | Andelman | 524/495 |
| 6,268,778 B1 | 7/2001 | Mucke et al. | 331/117 R |
| 6,664,863 B1 | 12/2003 | Okamoto et al. | 331/117 R |

\* cited by examiner

LOW COST ADJUSTABLE RF RESONATOR DEVICES MANUFACTURED FROM CONDUCTIVE LOADED RESIN-BASED MATERIALS

This Patent Application claims priority to the U.S. Provisional Patent Application 60/461,877, filed on Apr. 10, 2003 and to the U.S. Provisional Patent Application 60/478, 774, filed on Jun. 16, 2003 which are herein incorporated by reference in their entirety.

This Patent Application is a Continuation-in-Part of INT01-002CIP, filed as U.S. patent application Ser. No. 10/309,429, filed on Dec. 4, 2002, U.S. Pat. No. 6,870,516 also incorporated by reference in its entirety, which is a Continuation-in-Part application filed as U.S. patent application Ser. No. 10/075,778, filed on Feb. 14, 2002, now U.S. Pat. No. 6,741,221 which claimed priority to U.S. Provisional Patent Applications Ser. No. 60/317,808, filed on Sep. 7, 2001, Ser. No. 60/269,414, filed on Feb. 16, 2001, and Ser. No. 60/268,822, filed on Feb. 15, 2001.

BACKGROUND OF THE INVENTION (1) Field of the Invention

This invention relates to resonator devices and, more particularly, to inductor-capacitor (LC), adjustable RF resonator devices molded of conductive loaded resin-based materials comprising micron conductive powders, micron conductive fibers, or a combination thereof, homogenized within a base resin when molded. This manufacturing process yields a conductive part or material usable within the EMF or electronic spectrum(s).

(2) Description of the Prior Art

Resonator circuits are widely used in the art of electrical and electronic systems. Resonator circuits are specialized forms of oscillator circuits. An oscillator circuit swings between two modes, or states, on a periodic basis. Typical electrical oscillators swing between upper and lower voltage states in either a sinusoidal or a square wave fashion. Electrical oscillators are used in radio communications circuits for generating carrier waves or for tuning in stations. Many circuits use oscillator circuits for system clocks, video rastering, and the like.

One important method for generating an oscillating signal is the inductor-capacitor (LC) oscillator circuit. In a LC oscillator circuit, energy is stored temporarily in either the inductor or the capacitor. During each phase of oscillation, energy is transferred from the capacitor to the inductor or visa versa. The LC circuit oscillates at the resonance frequency specified by the combined reactance of the LC network. LC oscillators may combine active devices to provide energy of oscillation as well as to compensate for resistance loss.

A particular form of a LC oscillator circuit is the RF resonator circuit. The RF resonator circuit can be adjusted, or tuned, to a particular frequency during normal operation. RF resonator circuits formed from LC oscillators are typically tuned by altering the value of the inductor and/or the capacitor to thereby select the resonant frequency. This type of RF resonator circuit may be attached to an antenna that captures electromagnetic energy to thereby create a first stage of a RF receiver. Alternatively, the RF resonator circuit may control an amplifier to thereby drive a RF carrier signal onto a transmitting antenna. The ability of the RF resonator circuit to tune or to select a particular frequency of oscillation allows a single transmitter and/or receiver to broadcast and/or to receive RF signals of varying frequency. The LC resonator circuits in the art are typically fabricated using discrete capacitor and/or inductor components. These components require tooling and add assembly complexity. Alternatively, LC oscillator circuits have been integrated onto integrated circuits.

Several prior art inventions relate to resonator and/or oscillator circuits, inductors, capacitors, and the integration thereof. U.S. Pat. No. 6,111,343 to Unami et al teaches a piezoelectric resonator device including conductive resin film to reduce contact capacitance. U.S. Pat. No. 4,267,480 to Kanematsu et al teaches a piezoelectric resonator device. U.S. Pat. No. 4,786,837 to Kalnin et al teaches a composite ceramic/polymer sheet electrode transducer. U.S. Pat. No. 6,664,863 B1 to Okamoto et al teaches a LC oscillator integrated onto an IC. U.S. Pat. No. 6,268,778 B1 to Mucke et al teaches a voltage controlled oscillator using a LC resonator with tunable frequency based on a variable capacitor network. Cleland et al, in the article, "Fabrication of high frequency nanometer scale mechanical resonators from bulk Si crystal," Applied Physics Letter 69(18), 28 Oct. 1996, pp. 2653–55, teaches a crystal resonator on bulk Si.

SUMMARY OF THE INVENTION

A principal object of the present invention is to provide an effective RF resonator circuit device.

A further object of the present invention is to provide a method to form a RF resonator circuit device.

A further object of the present invention is to provide inductors and/or capacitors for RF resonator circuit devices molded of conductive loaded resin-based materials.

A yet further object of the present invention is to provide inductors and/or capacitors for RF resonator circuit devices molded of conductive loaded resin-based material where the oscillator device characteristics can be altered or the visual characteristics can be altered by forming a metal layer over the conductive loaded resin-based material.

A yet further object of the present invention is to provide methods to fabricate adjustable inductors and/or capacitors for RF resonator circuit devices from a conductive loaded resin-based material incorporating various forms of the material.

A yet further object of the present invention is to provide a method to fabricate inductors and/or capacitors for RF resonator circuit devices from a conductive loaded resin-based material where the material is in the form of a fabric.

A yet further object of the present invention is to provide an improved inductor device by improving the characteristics of the core material.

A yet further object of the present invention is to provide a method to replace discrete capacitors and/or inductors for RF resonator devices with capacitors and/or inductors molded into a circuit.

In accordance with the objects of this invention, a LC tunable resonator device is achieved. The device comprises a capacitor comprising a first plate comprising conductive loaded, resin-based material comprising conductive materials in a base resin host. A second plate is fixably held nearby but not contacting the first plate such that the first plate and the second plate are capacitively coupled. An inductor comprises a loop of the conductive loaded, resin-based material. At least one of the capacitor and the inductor has a varying value.

Also in accordance with the objects of this invention, a LC tunable resonator device is achieved. The device comprises a capacitor. The capacitor comprises a first plate and a second plate. The first plate comprises a conductive loaded, resin-based material comprising conductive materials in a base resin host. A second plate is fixably held nearby but not contacting the first plate such that the first plate and the second plate are capacitively coupled. An inductor comprises a loop of the conductive loaded, resin-based material. At least one of the capacitor and said inductor has a varying value. An antenna is coupled to the capacitor and the inductor.

Also in accordance with the objects of this invention, a method to form a LC resonator device is achieved. The method comprises providing a conductive loaded, resin-based material comprising conductive materials in a resin-based host. The conductive loaded, resin-based material is molded into the device.

BRIEF DESCRIPTION OF THE DRAWINGS

In the accompanying drawings forming a material part of this description, there is shown:

In FIG. 1a, an adjustable inductor is used for tuning. In FIG. 1b, an adjustable capacitor is used for tuning.

DESCRIPTION OF THE PREFERRED EMBODIMENTS

Figure 1A:
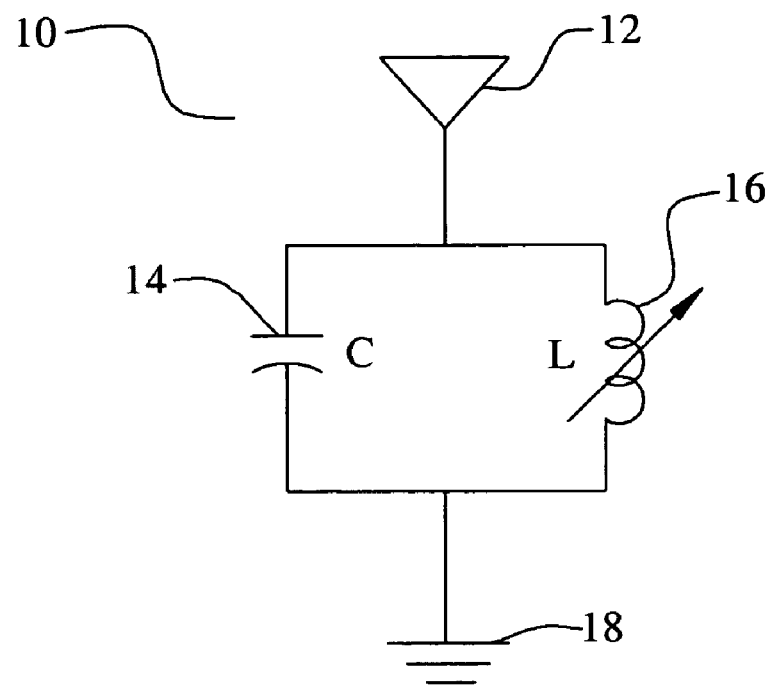
FIGS. 1a and 1b illustrate a first preferred embodiment of the present invention showing an inductor-capacitor (LC) RF resonator circuit with inductor and/or capacitor comprising a conductive loaded resin-based material.

This invention relates to inductor-capacitor (LC) RF resonator circuits molded of conductive loaded resin-based materials comprising micron conductive powders, micron conductive fibers, or a combination thereof, homogenized within a base resin when molded.

The conductive loaded resin-based materials of the invention are base resins loaded with conductive materials, which then makes any base resin a conductor rather than an insulator. The resins provide the structural integrity to the molded part. The micron conductive fibers, micron conductive powders, or a combination thereof, are homogenized within the resin during the molding process, providing the electrical continuity.

The conductive loaded resin-based materials can be molded, extruded or the like to provide almost any desired shape or size. The molded conductive loaded resin-based materials can also be cut, stamped, or vacuumed formed from an injection molded or extruded sheet or bar stock, over-molded, laminated, milled or the like to provide the desired shape and size. The thermal or electrical conductivity characteristics of inductor-capacitor (LC) RF resonator circuits fabricated using conductive loaded resin-based materials depend on the composition of the conductive loaded resin-based materials, of which the loading or doping parameters can be adjusted, to aid in achieving the desired structural, electrical or other physical characteristics of the material. The selected materials used to fabricate the inductor-capacitor (LC) RF resonator circuit circuits are homogenized together using molding techniques and or methods such as injection molding, over-molding, thermo-set, protrusion, extrusion or the like. Characteristics related to 2D, 3D, 4D, and 5D designs, molding and electrical characteristics, include the physical and electrical advantages that can be achieved during the molding process of the actual parts and the polymer physics associated within the conductive networks within the molded part(s) or formed material(s).

The use of conductive loaded resin-based materials in the fabrication of inductor-capacitor (LC) RF resonator circuits significantly lowers the cost of materials and the design and manufacturing processes used to hold ease of close tolerances, by forming these materials into desired shapes and sizes. The inductor-capacitor (LC) RF resonator circuits can be manufactured into infinite shapes and sizes using conventional forming methods such as injection molding, over-molding, or extrusion or the like. The conductive loaded resin-based materials, when molded, typically but not exclusively produce a desirable usable range of resistivity from between about 5 and 25 ohms per square, but other resistivities can be achieved by varying the doping parameters and/or resin selection(s).

The conductive loaded resin-based materials comprise micron conductive powders, micron conductive fibers, or in any combination thereof, which are homogenized together within the base resin, during the molding process, yielding an easy to produce low cost, electrically conductive, close tolerance manufactured part or circuit. The micron conductive powders can be of carbons, graphites, amines or the like, and/or of metal powders such as nickel, copper, silver, or plated or the like. The use of carbons or other forms of powders such as graphite(s) etc. can create additional low level electron exchange and, when used in combination with micron conductive fibers, creates a micron filler element within the micron conductive network of fiber(s) producing further electrical conductivity as well as acting as a lubricant for the molding equipment. The micron conductive fibers can be nickel plated carbon fiber, stainless steel fiber, copper fiber, silver fiber, or the like, or combinations thereof. The structural material is a material such as any polymer resin. Structural material can be, here given as examples and not as an exhaustive list, polymer resins produced by GE PLASTICS, Pittsfield, Mass., a range of other plastics produced by GE PLASTICS, Pittsfield, Mass., a range of other plastics produced by other manufacturers, silicones produced by GE SILICONES, Waterford, N.Y., or other flexible resin-based rubber compounds produced by other manufacturers.

The resin-based structural material loaded with micron conductive powders, micron conductive fibers, or in combination thereof can be molded, using conventional molding methods such as injection molding or over-molding, or extrusion to create desired shapes and sizes. The molded conductive loaded resin-based materials can also be stamped, cut or milled as desired to form create the desired shape form factor(s) of the heat sinks. The doping composition and directionality associated with the micron conductors within the loaded base resins can affect the electrical and structural characteristics of the inductor-capacitor (LC) RF resonator circuits and can be precisely controlled by mold designs, gating and or protrusion design(s) and or during the molding process itself. In addition, the resin base can be selected to obtain the desired thermal characteristics such as very high melting point or specific thermal conductivity.

A resin-based sandwich laminate could also be fabricated with random or continuous webbed micron stainless steel fibers or other conductive fibers, forming a cloth like material. The webbed conductive fiber can be laminated or the like to materials such as Teflon, Polyesters, or any resin-based flexible or solid material(s), which when discretely designed in fiber content(s), orientation(s) and shape(s), will produce a very highly conductive flexible cloth-like material. Such a cloth-like material could also be used in forming inductor-capacitor (LC) oscillator circuits that could be embedded in a person's clothing as well as other resin materials such as rubber(s) or plastic(s). When using conductive fibers as a webbed conductor as part of a laminate or cloth-like material, the fibers may have diameters of between about 3 and 12 microns, typically between about 8 and 12 microns or in the range of about 10 microns, with length(s) that can be seamless or overlapping.

The conductive loaded resin-based material of the present invention can be made resistant to corrosion and/or metal electrolysis by selecting micron conductive fiber and/or micron conductive powder and base resin that are resistant to corrosion and/or metal electrolysis. For example, if a corrosion/electrolysis resistant base resin is combined with stainless steel fiber and carbon fiber/powder, then a corrosion and/or metal electrolysis resistant conductive loaded resin-based material is achieved. Another additional and important feature of the present invention is that the conductive loaded resin-based material of the present invention may be made flame retardant. Selection of a flame-retardant (FR) base resin material allows the resulting product to exhibit flame retardant capability. This is especially important in inductor-capacitor (LC) oscillator circuits applications as described herein.

The homogeneous mixing of micron conductive fiber and/or micron conductive powder and base resin described in the present invention may also be described as doping. That is, the homogeneous mixing converts the typically non-conductive base resin material into a conductive material. This process is analogous to the doping process whereby a semiconductor material, such as silicon, can be converted into a conductive material through the introduction of donor/acceptor ions as is well known in the art of semiconductor devices. Therefore, the present invention uses the term doping to mean converting a typically non-conductive base resin material into a conductive material through the homogeneous mixing of micron conductive fiber and/or micron conductive powder into a base resin.

As an additional and important feature of the present invention, the molded conductor loaded resin-based material exhibits excellent thermal dissipation characteristics. Therefore, inductor-capacitor (LC) RF resonator circuits manufactured from the molded conductor loaded resin-based material can provide added thermal dissipation capabilities to the application. For example, heat can be dissipated from electrical devices physically and/or electrically connected to an inductor-capacitor (LC) RF resonator circuit of the present invention.

Figure 1B:
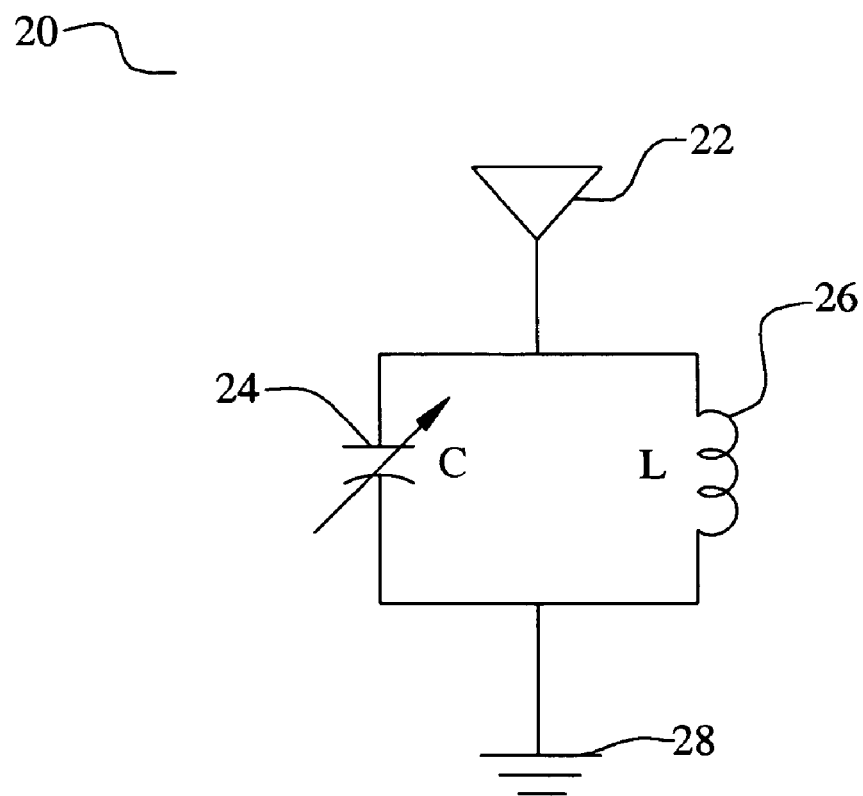

Referring now to FIGS. 1a and 1b, a first preferred embodiment of the present invention is illustrated. An inductor-capacitor (LC) RF resonator circuit 10 is shown. The LC RF resonator circuit 10, or network, comprises parallel connected inductor L 14 and capacitor 16. In this configuration, energy is coupled into the circuit 10 from an antenna 12. This energy will begin to oscillate between temporary storage in the inductor L 14 and in the capacitor C 16 as it discharges to ground 18. For example, as electrostatic field energy begins to discharge from the capacitor C 14, current flows through the inductor L 16 to thereby create a magnetic field. Once the capacitor C 14 completely discharges, the back EMF of the inductor L 16 attempts to maintain the current flow and thereby begins to charge the capacitor C 14 in the opposite polarity as at the beginning of the cycle. The inductor L 16 magnetic field completely collapses just as the capacitor C 14 is recharged to the opposite polarity. At this point, the cycle begins with current flow in the opposite direction.

The LC RF resonator circuit 10 will accept energy of any frequency. However, energy at the resonant frequency ($f_o$) is sustained more easily in the LC circuit 10 than energy at other frequencies. This resonant frequency is given by:

$$f_o = 1/2\pi(LC)^{1/2}$$

Energy at this resonant frequency $f_o$ will be captured more efficiently (with less loss) by the resonator 10. In the present invention, the inductor L 16 and/or the capacitor C 14 comprise a conductive loaded resin-based material according to the present invention. Further, the inductor L 16 is a variable value inductor. By varying the value of the inductor L 16, the resonance frequency $f_o$ of the RF resonant circuit 10 can be selected according to the above equation. In this way, the RF resonator circuit 10 can be tuned to a particular frequency of electromagnetic energy. This function is particularly useful for application of the RF resonance circuit 10 to reception of multiple frequency signals such as in a radio receiver.

Referring now to FIG. 1b, the RF resonance circuit 20 may alternatively comprise a variable capacitor 24 and a fixed inductor 26 between the antenna 22 and ground 28. By varying the value of the capacitor 24, the resonance frequency $f_o$ of the RF resonant circuit 20 may again be selected according to the above equation. Alternatively, a RF resonance circuit where both the capacitance value and the inductor value are variable may be realized using capacitor and/or inductor devices according to the present invention.

In the present invention, the inductor L 26 and/or the capacitor C 24 comprise a conductive loaded resin-based material according to the present invention. The use of the conductive loaded resin-material to form capacitor plates and/or inductor cores and/or inductor windings encompasses several important features as discussed below and as shown in the preferred embodiments of FIGS. 7 through 11. In addition, in FIGS. 12, 13, and 14a through 14c, several preferred embodiments of variable inductor and capacitor devices are shown. It is particularly important to note that the capacitor or the inductor or both the capacitor and the inductor may comprise the conductive loaded resin-based material. The inductor or capacitor may be formed separately and assembled together. Alternatively, the inductor or capacitor may be formed together using, for example, a molding operation. It is further understood that multiple capacitor or multiple inductor circuits or circuits with different configurations of inductor and capacitor devices where either the capacitor or the inductor or both the capacitor and the inductor comprise the conductive loaded resin-based material are within the scope of the present invention. Finally, the antenna 22 may additionally comprise the conductive loaded resin-based material according to the invention. In this regard, the entire RF resonator circuit 20 may be molded of the conductive loaded resin-based material according to the present invention.

Figure 7:
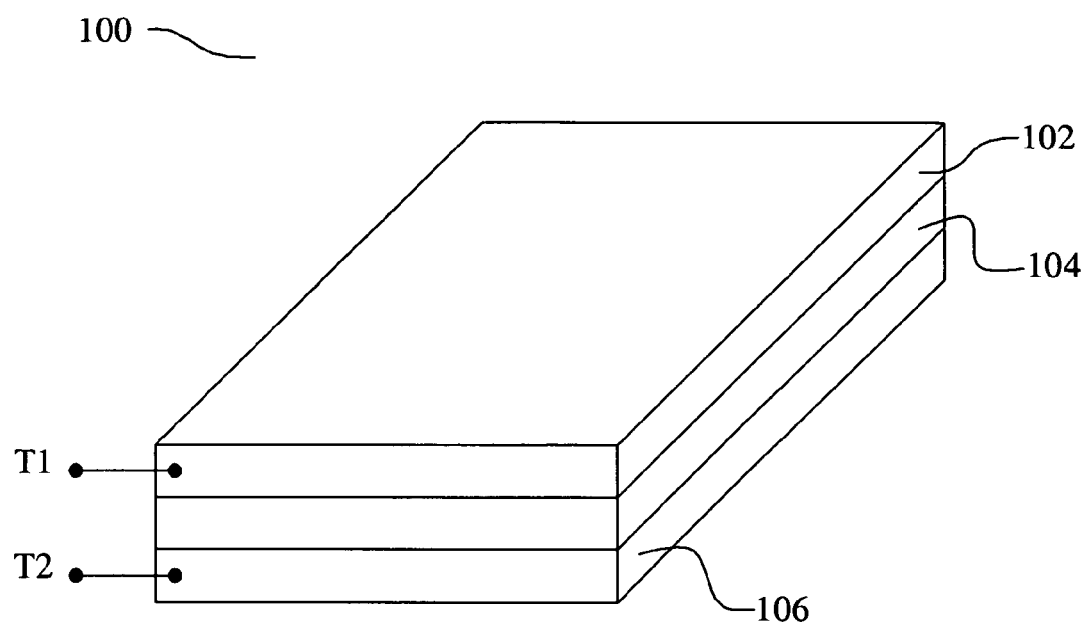
FIG. 7 illustrates a second preferred embodiment of the present invention further showing a capacitor device for a LC RF resonator circuit comprising plates of conductive loaded resin-based material.

Referring now particularly to FIG. 7, a second preferred embodiment of the present invention is illustrated. In this embodiment, a capacitor device, or capacitor enhanced circuit section, 100 for the LC circuit of the present invention is formed of conductive loaded resin-based material according to the present invention. More particularly, the capacitor 100 comprises plates 102 and 106 of conductive loaded resin-based material where the plates are separated by a dielectric layer 104. In the preferred case, the dielectric layer 104 comprises a resin-based material and, more preferably, comprises the same base resin as is used in the plates 102 and 1066. The capacitor 100 is preferably a molded device and is more preferably molded onto or into a circuit where the conductive loaded resin-based material provides electrical connection.

For example, the lower plate 106 or terminal (T2) of the capacitor 100 is injection molded of conductive loaded resin-based material. Next, the dielectric layer 104, comprising the same base resin material but without the conductive loading, is over-molded onto the lower plate 106. Finally, the upper plate 102 or terminal (T1) is over-molded onto the dielectric layer 104. Preferably, the upper and lower plates 102 and 106 comprise the same composition of conductive loaded resin-based material but this is not essential to the present invention. Alternatively, the dielectric layer 104 may be any type of insulator exhibiting a dielectric constant value in the needed range for the particular capacitor. For example, a layer of ceramic, mica, polyester, or paper may be used as the dielectric layer 104. Alternatively, the top and bottom plates 102 and 106 may be separated only by air 104. In this case, the air 104 is the used as the dielectric. The dielectric layer 104 may be applied by over-molding, extrusion, spraying, dipping, coating, or insertion (as in the case of paper). Conversely, the upper and lower plates 102 and 106 may be over-molded onto a previously formed dielectric layer 104. For example, a thin layer of ceramic 104 may first be formed. Then, upper and lower plates of conductive loaded resin-based material 102 and 106 may be over-molded onto the ceramic dielectric 104. Alternatively, upper and lower plates 102 and 106 may be extruded over a pre-formed dielectric layer 104. The plates 102 and 106 may be formed as a continuous piece of conductive loaded resin-based material surrounding a dielectric layer 104 and then trimmed, cut, stamped, milled, or the like, to electrically separate the upper and lower plates 102 and 106 and to complete the capacitor.

Figure 8:
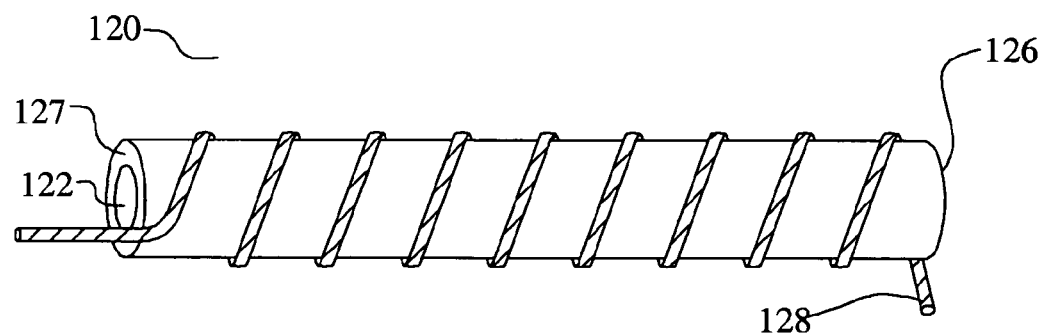
FIG. 8 illustrates a third preferred embodiment of the present invention further showing an inductor device for a LC RF resonator circuit with a core comprising conductive loaded resin-based material.

Referring now to FIG. 8, a third preferred embodiment of the present invention is illustrated. An inductor 120 for the LC circuit of the present invention is illustrated. In this case, the core 126 comprises the conductive loaded resin-based material 122 with an insulating layer 124 overlying. A metal wire 128 is formed around the core 126 as the conductor. Alternatively, the conductor 128 may comprise conductive loaded resin-based material as is discussed below. The excellent permeability of the conductive loaded resin-based material 122 is featured. In particular, a molded conductive loaded resin-based core 122 can easily be made if a conductive loading material with a high permeability is chosen. For example, conductive loading materials with a high iron content are particularly useful in forming a high permeability core 122. In the preferred embodiment, the core comprises a conductive loaded resin based center 122 surrounded by an insulating layer 124. More preferably, the center core 122 is first molded of conductive loaded resin-based material using injection molding or extrusion, and then the insulating layer 124 is over-molded, coated, or extruded over the center core 122. Finally, a metal wire conductor 128 is wound around the core 122 to complete the inductor 120. Alternatively, the conductor 128 may comprise yet more conductive loaded resin-based material that is over-molded onto the core 126.

This inductor device 120 allows a large inductance value to be generated through the use the high permeability core material 122. The moldability of the conductive loaded resin-based material of the core 122 allows for more flexible manufacturing methods and for integration of the inductor into a conductive loaded resin-based circuit design. In addition, the conductive loaded resin-based core will exhibit corrosion and/or electrolysis resistance. Further, by adjusting the doping level and/or of the type of conductive material in the conductive loaded resin-based material, the permeability and the resistivity of the core 122 can be easily optimized.

In particular, a molded conductive loaded resin-based core 122 can easily be made if a conductive loading material with a high permeability is chosen. For example, conductive loading materials with a high iron content are particularly useful in forming the high permeability core 122. As a particular example, an austinetic stainless steel fiber or powder is particularly useful since this type of stainless steel alloy has a relatively high iron content. In addition, the permeability of the base resin material is an important consideration. Preferably, a base resin material of relatively high permeability is used for the core.

Figure 9:
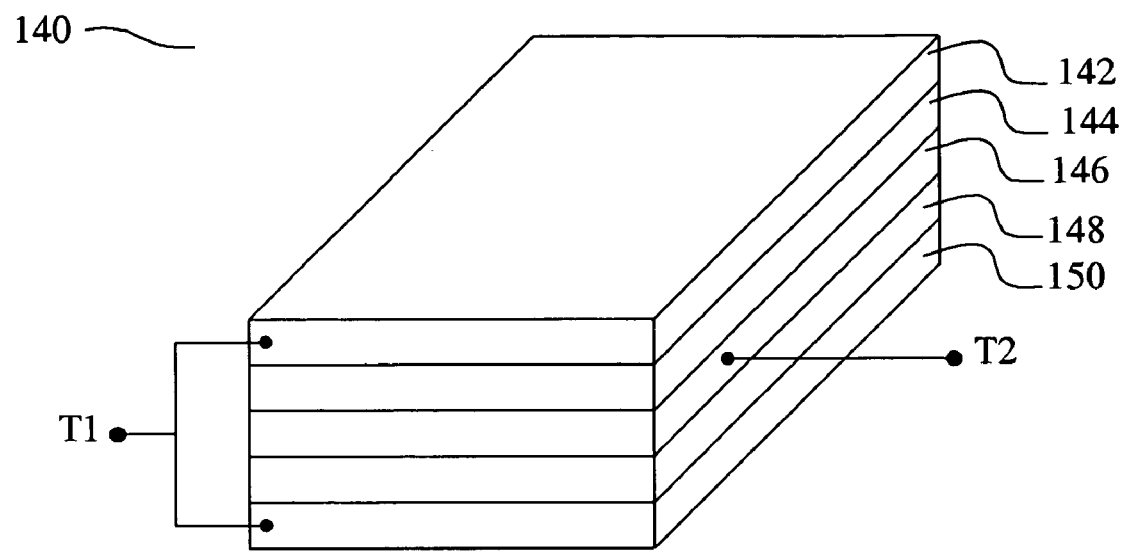
FIG. 9 illustrates a fourth preferred embodiment of the present invention further showing a capacitor device for a LC RF resonator circuit comprising a multiple layer stack of plates of conductive loaded resin-based material.

Referring now to FIG. 9, a fourth preferred embodiment 140 of the present invention is illustrated. In this embodiment, a stacked capacitor device 140, or capacitor enhanced circuit section, for the LC circuit of the present invention is formed of conductive loaded resin-based material according to the present invention. In this case, the middle layer 146 of the stack 140 is one capacitor plate or terminal (T2), while the upper most and lower most layers of conductive loaded resin-based material 142 and 150 are connected together to form the other capacitor plate (T1). Dielectric layers 144 and 148 are used to separate the capacitor plates 142, 146, and 150. Molding techniques, such as calendaring, that are useful for forming sheets of resin-based material, may be used according to the present invention to form sheets of conductive loaded resin-based material 142, 146, and 150, which can then be stacked with intervening dielectric layers 144 and 148 to form large value capacitors. For example, the stack 140 may be bound together using ultrasonic welding.

The conductive loaded resin-based capacitor plates 142, 146, and 150 of the present invention allow the capacitor devices to be molded into a circuit or a circuit housing. Further, these plates can be formulated to exhibit excellent corrosion and/or electrolysis resistance and/or moisture penetration resistance such that the resulting capacitor structure can be used in environmentally challenging environments. For example, by selecting a corrosion resistant base resin and a corrosion resistant conductive load, such as stainless steel, the resulting capacitor plates 142, 146, and 150, can be made corrosion resistant. In addition, the resistivity of the conductive loaded resin-based material can be easily optimized by altering the ratio of doping material to base-resin material. In this way, a passive resistance value can be built into the capacitor plates 142, 146, and 150. The ability to mold the capacitor devices into the circuit or housing facilitates reducing the number of discrete capacitor components in a circuit to thereby reduce part count, tooling costs, and assembly complexity. As yet another alternative, the inner plate 146 may comprise any conductive material including a metallic material. In this case, a dielectric layer 144 and 148 may be coated onto the metal inner plate 146. Then a conductive loaded resin based material 142 and 150 is simply over-molded onto the metal inner plates 146 with a dielectric coating 144 and 148 therebetween to form the capacitor 140.

Figure 10:
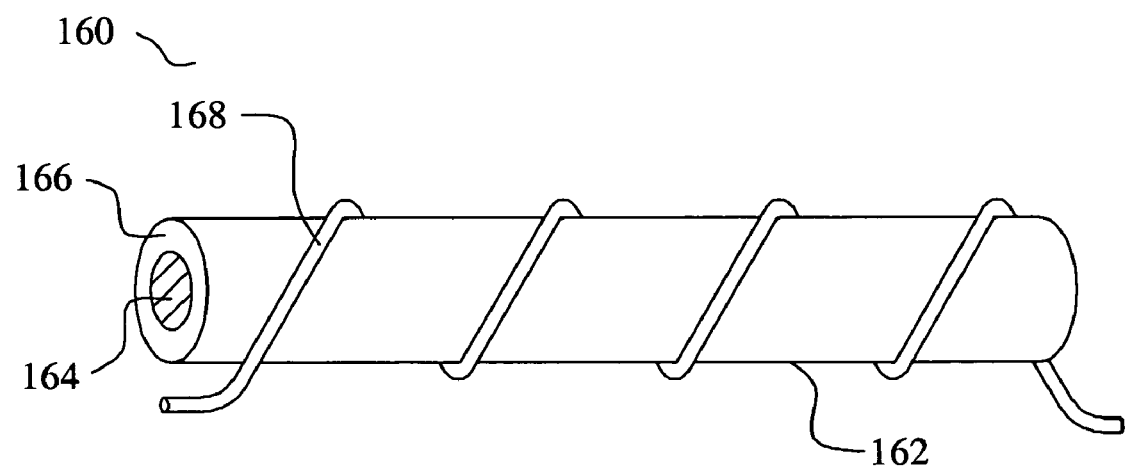
FIG. 10 illustrates a fifth preferred embodiment of the present invention further showing an inductor device for a LC RF resonator circuit comprising a wound conductor of conductive loaded resin-based material.

Referring now to FIG. 10, a fifth preferred embodiment of the present invention is illustrated. An inductor 160 for the LC circuit of the present invention is illustrated. A conductive loaded resin-based conductor 168 is formed around a core 162. A core material is not essential to this embodiment. However, if used, a core 162 can increase the inductor value and/or provide electrical isolation and/or mechanical stability to the inductor 160. The core material 162 may comprise any of several materials. For example, the core 162 may simply comprise an insulating material of relatively low permeability. In this case, the core 162 may simply provide mechanical stability and electrical isolation. For example, a resin-based material may be first molded to form a core 162. Then the conductor 168 of conductive loaded resin-based material is over-molded onto the core 162. In this case, the core 162 may be hollow (air core) or may be solid. Alternatively, if the conductive loaded resin-based material is first formed into a fabric-like material, then this material 168 may be wound onto the core 162.

Alternatively, a conductive core 164 may be used. As is discussed above, the permeability of the core material will determine how much the core affects the inductance. For example, iron is well known as a core material with a high permeability. In the preferred embodiment shown, the core comprises a metal inner layer 164 with a surrounding insulating layer 166. In this arrangement, the insulating layer 166 may be applied to a previously formed metal core 164. Then the coil conductor 168 of conductive loaded resin-based material is over-molded onto the core 162. The resulting inductor 160 exhibits a higher inductance value due to the presence of the metal core 164.

The conductive loaded resin-based coil 168 may be used to form an inductor 160 of high inductance. In addition, by selecting the conductive material doping level of the conductive loaded resin-based material 168, the resistance of the inductor 10 can be carefully controlled. For example, by selecting a higher ratio of conductive material to base resin, a low resistivity conductive loaded resin-based material 168 is formed. Alternatively, by using a lower ratio of conductive material to base resin, a high resistivity conductive loaded resin-based material 168 is formed. In this way, the parasitic resistance of the inductor 160 can be carefully designed.

Figure 11:
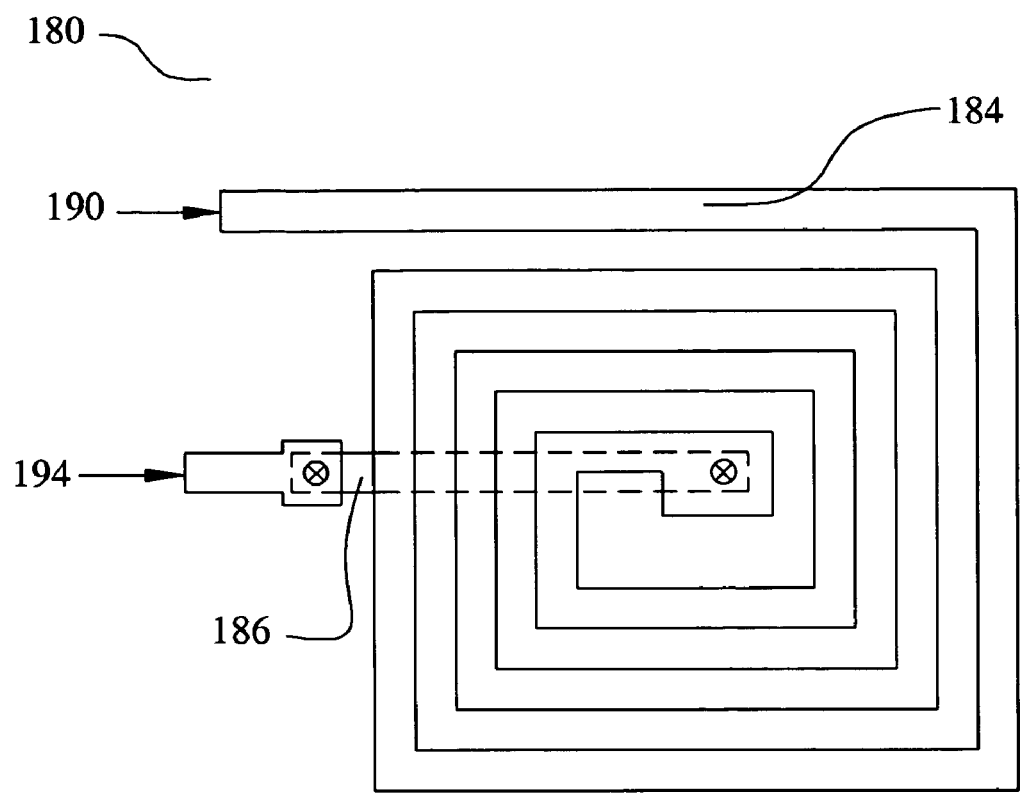
FIG. 11 illustrates a sixth preferred embodiment of the present invention further showing an inductor device for a LC RF resonator circuit comprising a spiral wind of conductive loaded resin-based material.

Referring now to FIG. 11, a sixth preferred embodiment of the present invention is illustrated. A spiral inductor device 180 for the LC oscillator circuit of the present invention is illustrated. The spiral inductor 180 again comprises the conductive loaded resin-based material of the present invention. The spiral pattern forms parallel signal lines for current to flow from a first terminal 190 to a second terminal 194 or visa versa. A bridge section 186 connects over or under the spiral lines 184 to connect the second terminal 194 to the internal termination of the inductor 180. The spiral inductor 180 will generate magnetic field perpendicular to the plane of the inductor 180. This inductor device 180 is easily formed by injection molding, over-molding, and the like. Alternatively, a flexible conductive loaded resin-based material 184 may be extrusion molded and then formed into the spiral shape.

The various inductor and capacitor embodiments of the present invention may be integrated together to provide oscillator circuits with L and C functions. These functions can be easily molded into a circuit or housing to thereby save part count, tooling cost, and assembly complexity. The performance and/or visual characteristics of the capacitor and/or the inductor devices can be altered by forming a metal layer over the conductive loaded resin-based material. If this metal layer is used and if the method of formation is metal plating, then the resin-based structural material of the conductive loaded, resin-based material is one that can be metal plated. There are very many of the polymer resins that can be plated with metal layers. For example, GE Plastics, SUPEC, VALOX, ULTEM, CYCOLAC, UGIKRAL, STYRON, CYCOLOY are a few resin-based materials that can be metal plated. The metal layer may be formed by, for example, electroplating or physical vapor deposition.

Figure 12:
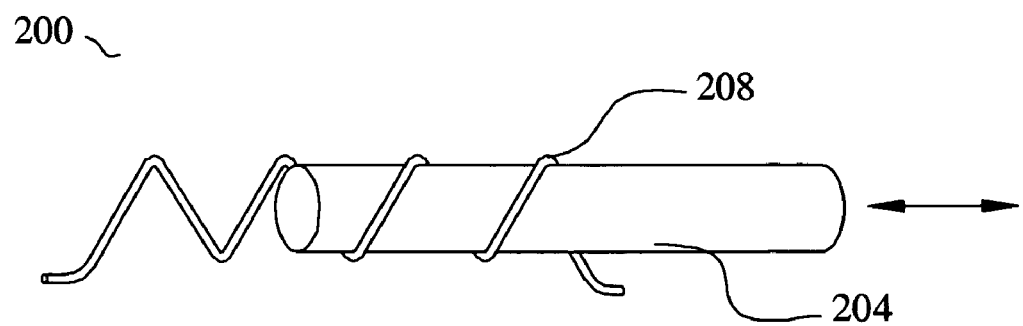
FIG. 12 illustrates a seventh preferred embodiment of the present invention further showing an adjustable inductor device for a LC RF resonator circuit with a movable relationship between the winding and the core.

Referring now to FIG. 12, a seventh preferred embodiment of the present invention is illustrated. An adjustable inductor device 200 for a LC RF resonator circuit is shown. The adjustable inductor device 200 comprises a core 204 and a winding 208 with a movable relationship. That is, the core 204 can be moved into or out of the winding 208 to create a variable amount of winding overlap with the core 204. The value of the inductor between the terminations of the winding 208 will vary according to the relative amount of core 204 insertion into the hollow of the winding 208. In this embodiment, the core 204 may comprise the conductive loaded resin-based material, the winding 208 may comprise the conductive loaded resin-based material, or both the core 204 and the winding 208 may comprise the conductive loaded resin-based material.

Figure 13:
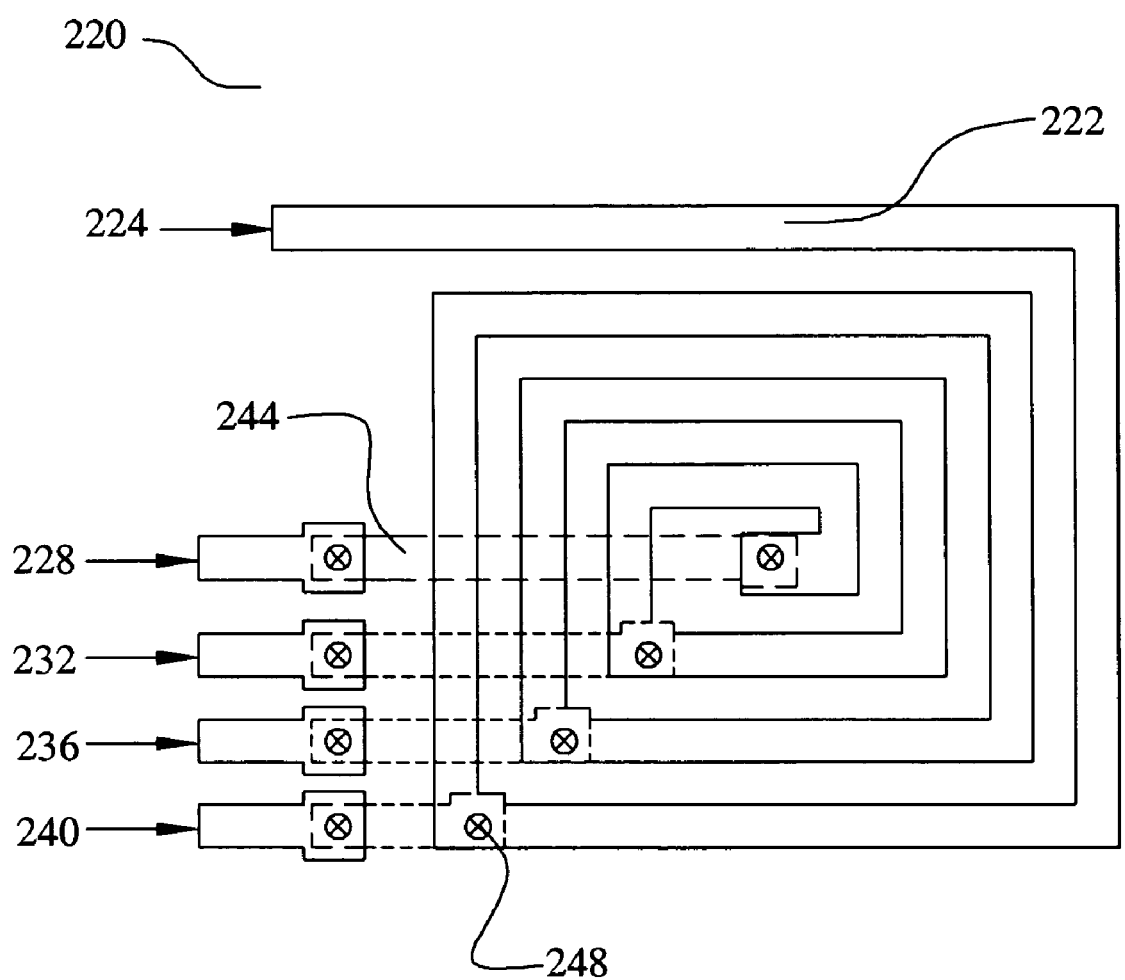
FIG. 13 illustrates an eighth preferred embodiment of the present invention further showing an adjustable spiral inductor device for a LC RF resonator circuit with selectable tap points.

Referring now to FIG. 13, an eighth preferred embodiment of the present invention is illustrated. In this embodiment, an adjustable spiral inductor device 220 for a LC RF resonator circuit is illustrated. The spiral inductor 220 again comprises the conductive loaded resin-based material of the present invention. The spiral pattern forms parallel signal lines 222 for current to flow from a first terminal 224 to any one of the second terminals 228, 232, 236, or 240, or visa versa. Bridge sections 244 connects over or under the spiral lines 222 to connect the second terminals 228, 232, 236, and 240 terminal 194 to internal terminations of the inductor 220 at various lengths. For example, a connection to the topmost second terminal 228 will create a spiral current path with four winds and with the largest inductive value. If the connection is moved to the next terminal 232 down, then the spiral current path with three winds and with the next largest inductive value is selected, and so on. A switching circuit, not shown, can easily be made to select between each terminal. The variable spiral inductor 220 will generate magnetic field perpendicular to the plane of the inductor 220. This variable inductor device 220 is easily formed by injection molding, over-molding, and the like. Alternatively, a flexible conductive loaded resin-based material 222 may be extrusion molded and then formed into the spiral shape.

Figure 14A:
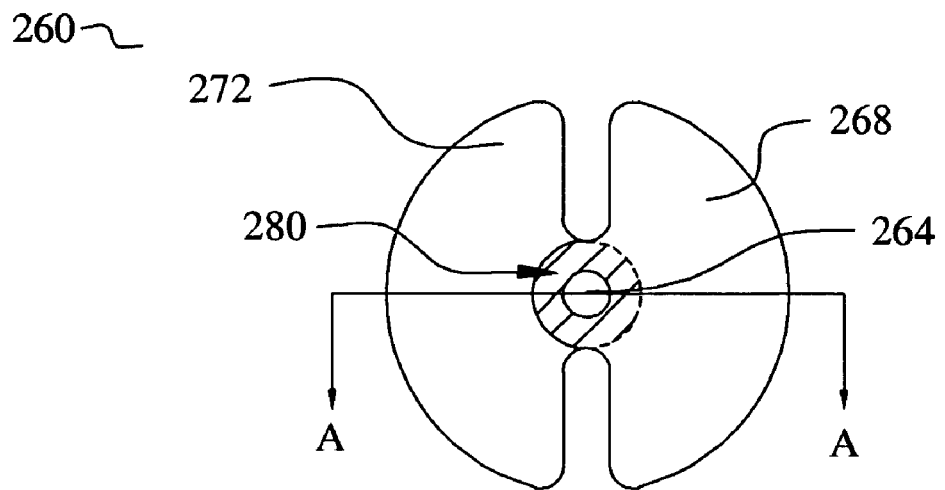
FIGS. 14a through 14c, illustrate a ninth preferred embodiment of the present invention showing an adjustable capacitor device for a LC RF resonator circuit with a movable relationship between the capacitor plates.
Figure 14B:
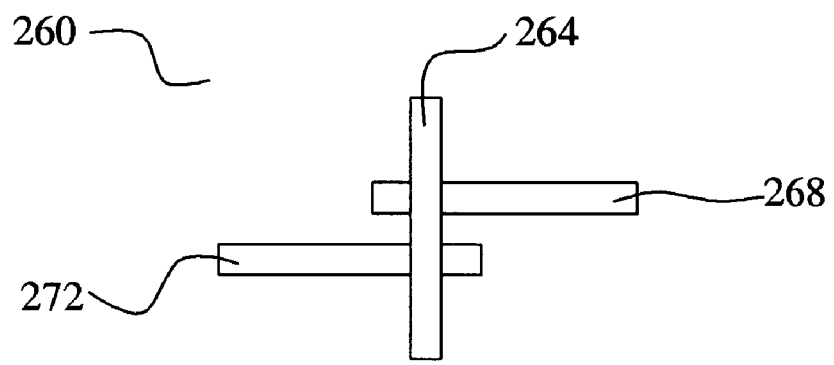
Figure 14C:
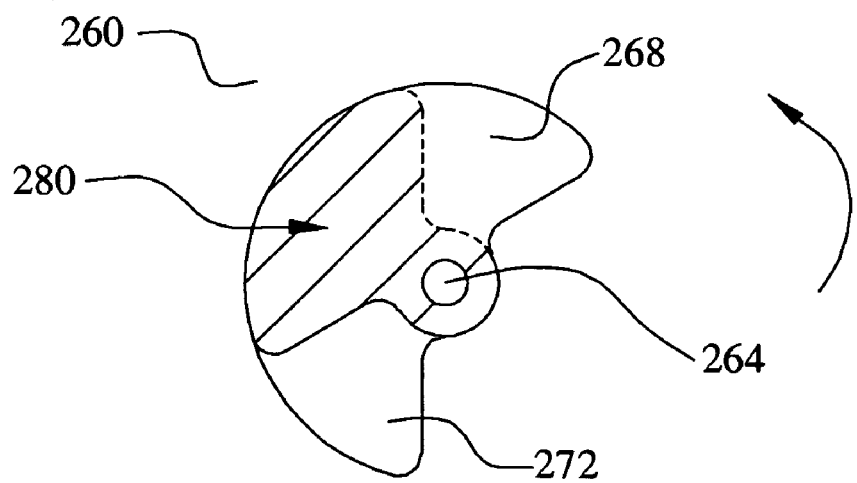

Referring now to FIGS. 14a through 14c, a ninth preferred embodiment of the present invention is illustrated. An adjustable capacitor device 260 for a LC RF resonator circuit is shown. The adjustable capacitor device 260 comprises first and second plates 268 and 272 of the conductive loaded resin-based material. The plates 272 and 268 are held near one another, though not touching, to thereby create significant capacitive coupling. Further, a movable relationship is created between the capacitor plates 268 and 272 such that the overlap between the plates can be varied. In the embodiment shown, a pin 264 is used to maintain a fixed separation between the plates 268 and 272 as shown in the cross section of FIG. 14b. The top view is illustrated in FIG. 14a showing a minimal overlap area 280 between the plates. In this position, the variable capacitor 14c exhibits a minimal capacitance value. In FIG. 14c, one plate 268 is rotated around the pivot pin 264 such that the overlap area 280 between the plates substantially increases. As a result, the capacitance value increases. The variable capacitor device 260 may be fabricated, for example, by molding the top and bottom plates 268 and 272 of conductive loaded resin-based material and then assembling these plates onto an insulating pin 264.

Figure 2:
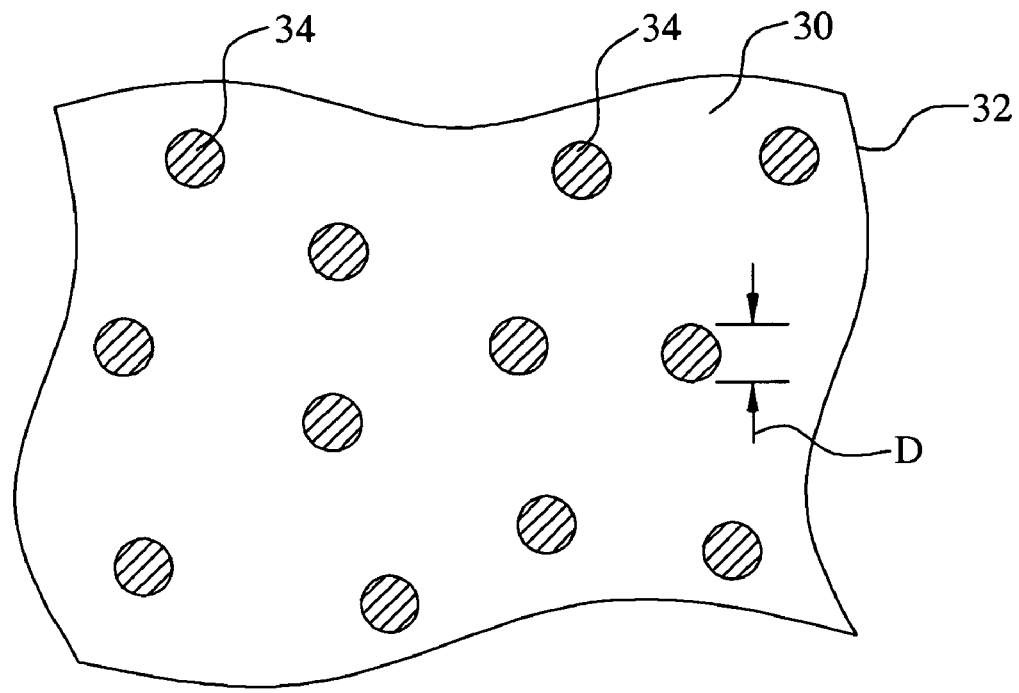
FIG. 2 illustrates a first preferred embodiment of a conductive loaded resin-based material wherein the conductive materials comprise a powder.

The conductive loaded resin-based material typically comprises a micron powder(s) of conductor particles and/or in combination of micron fiber(s) homogenized within a base resin host. FIG. 2 shows cross section view of an example of conductor loaded resin-based material 32 having powder of conductor particles 34 in a base resin host 30. In this example the diameter D of the conductor particles 34 in the powder is between about 3 and 12 microns.

Figure 3:
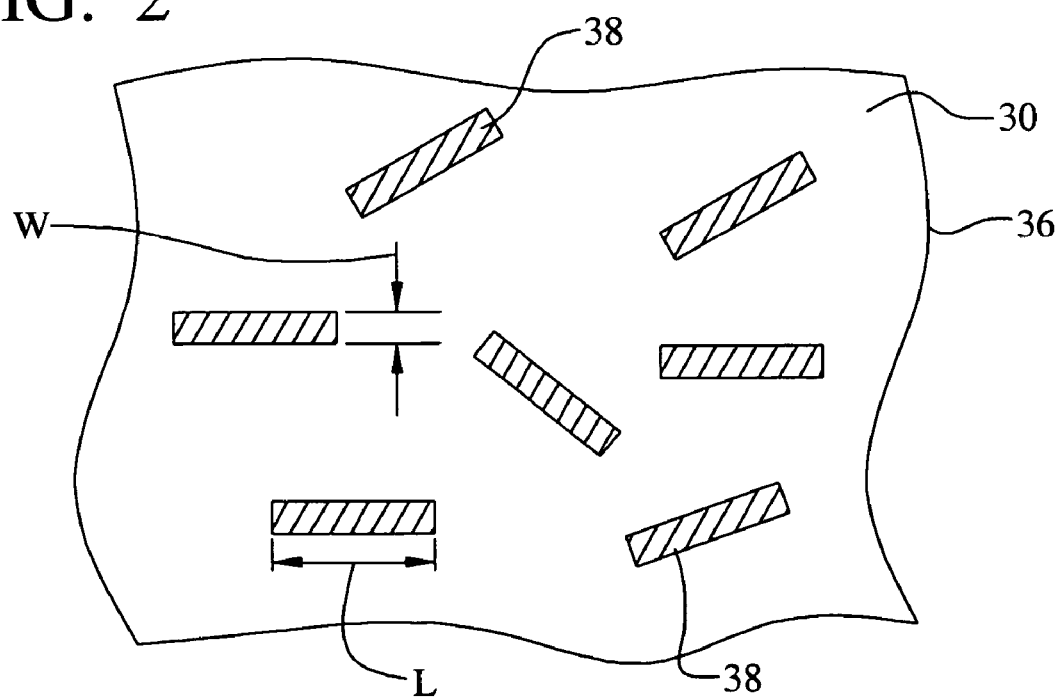
FIG. 3 illustrates a second preferred embodiment of a conductive loaded resin-based material wherein the conductive materials comprise micron conductive fibers.
Figure 4:
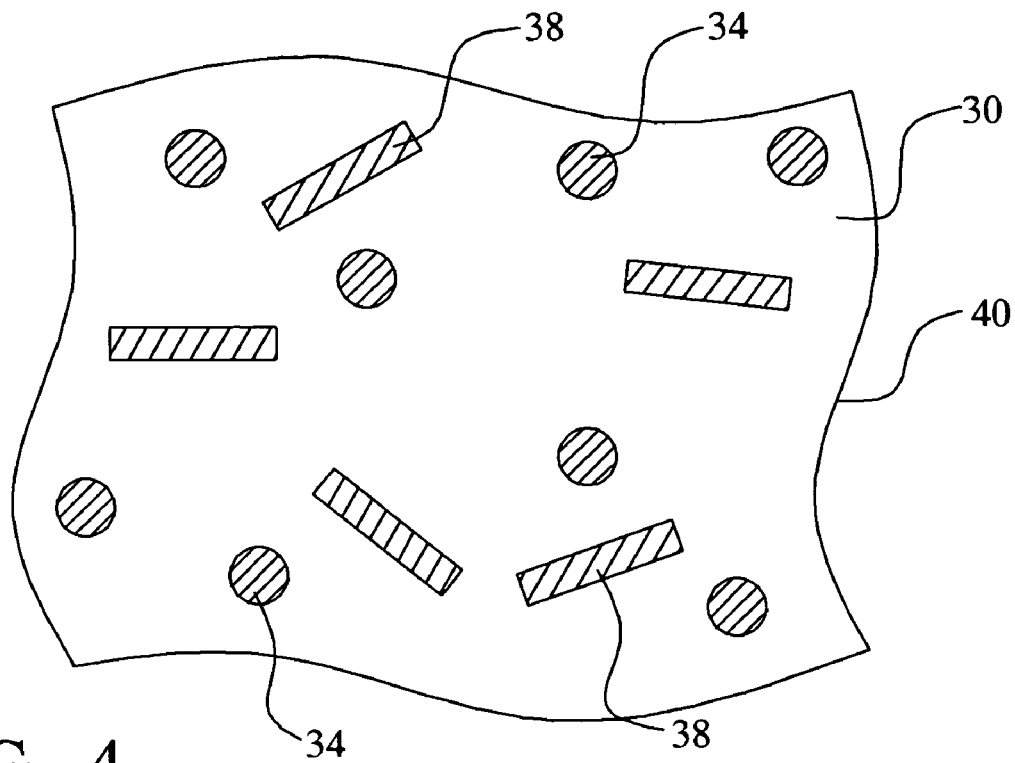
FIG. 4 illustrates a third preferred embodiment of a conductive loaded resin-based material wherein the conductive materials comprise both conductive powder and micron conductive fibers.

FIG. 3 shows a cross section view of an example of conductor loaded resin-based material 36 having conductor fibers 38 in a base resin host 30. The conductor fibers 38 have a diameter of between about 3 and 12 microns, typically in the range of 10 microns or between about 8 and 12 microns, and a length of between about 2 and 14 millimeters. The conductors used for these conductor particles 34 or conductor fibers 38 can be stainless steel, nickel, copper, silver, or other suitable metals or conductive fibers, or combinations thereof. These conductor particles and or fibers are homogenized within a base resin. As previously mentioned, the conductive loaded resin-based materials have a resistivity between about 5 and 25 ohms per square, other resistivities can be achieved by varying the doping parameters and/or resin selection. To realize this resistivity the ratio of the weight of the conductor material, in this example the conductor particles 34 or conductor fibers 38, to the weight of the base resin host 30 is between about 0.20 and 0.40, and is preferably about 0.30. Stainless Steel Fiber of 8–11 micron in diameter and lengths of 4–6 mm with a fiber weight to base resin weight ratio of 0.30 will produce a very highly conductive parameter, efficient within any EMF spectrum. Referring now to FIG. 4, another preferred embodiment of the present invention is illustrated where the conductive materials comprise a combination of both conductive powders 34 and micron conductive fibers 38 homogenized together within the resin base 30 during a molding process.

Figure 5A:
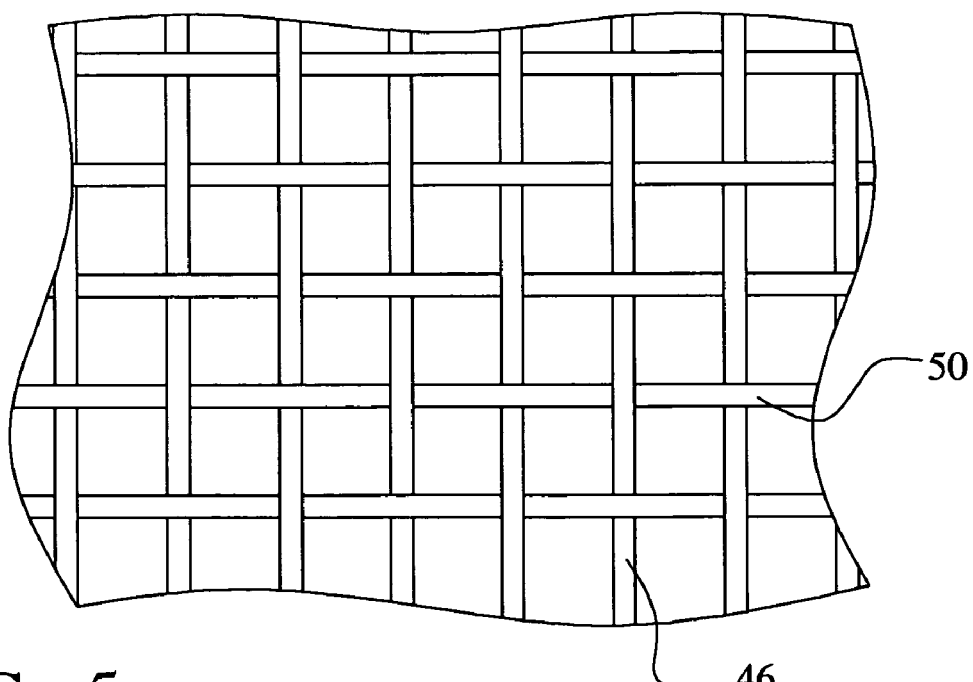
FIGS. 5a and 5b illustrate a fourth preferred embodiment wherein conductive fabric-like materials are formed from the conductive loaded resin-based material.
Figure 5B:
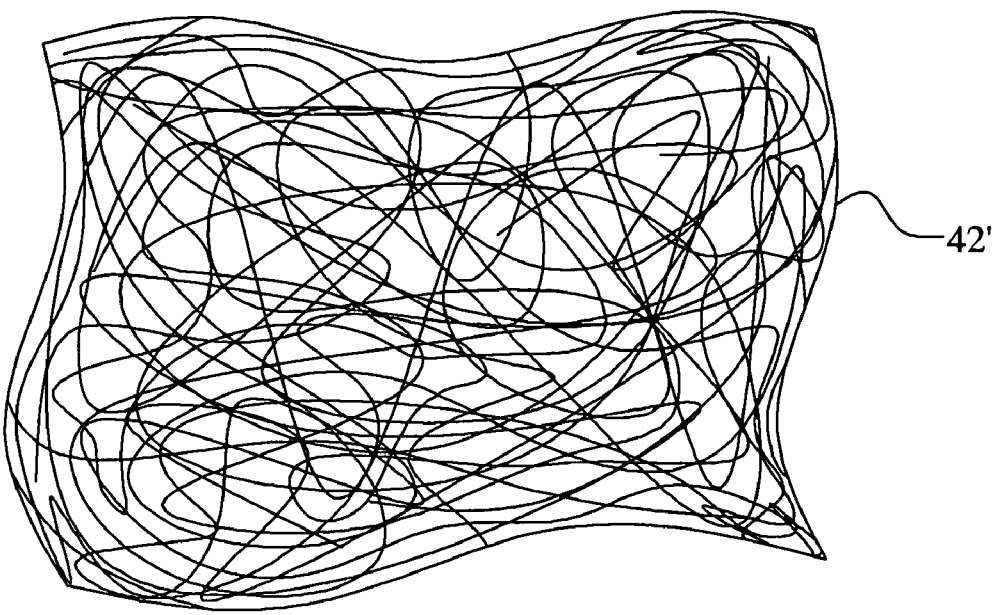

Referring now to FIGS. 5a and 5b, a preferred composition of the conductive loaded, resin-based material is illustrated. The conductive loaded resin-based material can be formed into fibers or textiles that are then woven or webbed into a conductive fabric. The conductive loaded resin-based material is formed in strands that can be woven as shown. FIG. 5a shows a conductive fabric 42 where the fibers are woven together in a two-dimensional weave 46 and 50 of fibers or textiles. FIG. 5b shows a conductive fabric 42' where the fibers are formed in a webbed arrangement. In the webbed arrangement, one or more continuous strands of the conductive fiber are nested in a random fashion. The resulting conductive fabrics or textiles 42, see FIG. 5a, and 42', see FIG. 5b, can be made very thin, thick, rigid, flexible or in solid form(s).

Similarly, a conductive, but cloth-like, material can be formed using woven or webbed micron stainless steel fibers, or other micron conductive fibers. These woven or webbed conductive cloths could also be sandwich laminated to one or more layers of materials such as Polyester(s), Teflon(s), Kevlar(s) or any other desired resin-based material(s). This conductive fabric may then be cut into desired shapes and sizes.

Figures 6A, 6B:
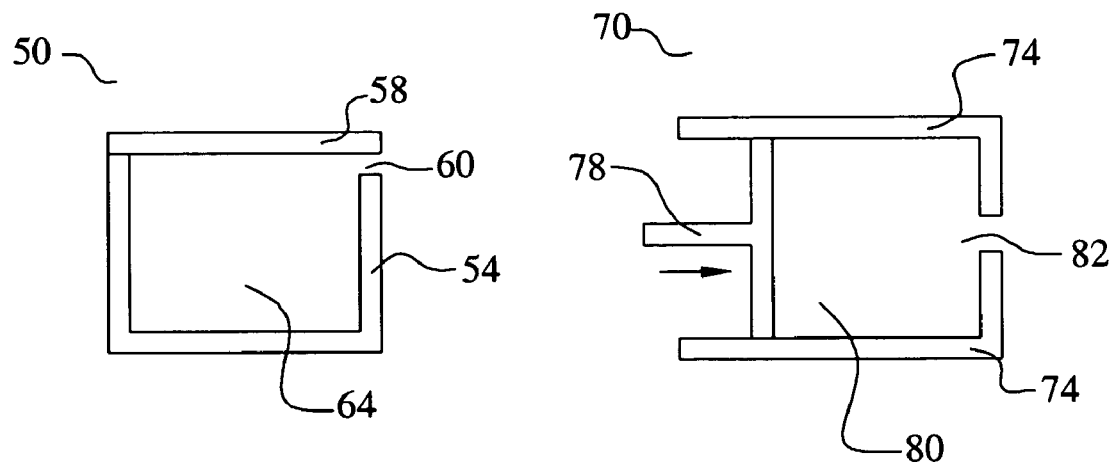
FIGS. 6a and 6b illustrate, in simplified schematic form, an injection molding apparatus and an extrusion molding apparatus that may be used to mold capacitors and/or inductors for LC oscillator circuits of a conductive loaded resin-based material.

Inductor-capacitor (LC) oscillator circuits formed from conductive loaded resin-based materials can be formed or molded in a number of different ways including injection molding, extrusion or chemically induced molding or forming. FIG. 6a shows a simplified schematic diagram of an injection mold showing a lower portion 54 and upper portion 58 of the mold 50. Conductive loaded blended resin-based material is injected into the mold cavity 64 through an injection opening 60 and then the homogenized conductive material cures by thermal reaction. The upper portion 58 and lower portion 54 of the mold are then separated or parted and the inductor-capacitor (LC) oscillator circuits are removed.

FIG. 6b shows a simplified schematic diagram of an extruder 70 for forming inductor-capacitor (LC) oscillator circuits using extrusion. Conductive loaded resin-based material(s) is placed in the hopper 80 of the extrusion unit 74. A piston, screw, press or other means 78 is then used to force the thermally molten or a chemically induced curing conductive loaded resin-based material through an extrusion opening 82 which shapes the thermally molten curing or chemically induced cured conductive loaded resin-based material to the desired shape. The conductive loaded resin-based material is then fully cured by chemical reaction or thermal reaction to a hardened or pliable state and is ready for use.

The advantages of the present invention may now be summarized. An effective oscillator circuit device and method of manufacture is achieved. Inductors and/or capacitors for oscillator circuit devices are molded of conductive loaded resin-based materials. The oscillator device characteristics can be altered or the visual characteristics can be altered by forming a metal layer over the conductive loaded resin-based material. Methods to fabricate inductors and/or capacitors for oscillator circuit devices from a conductive loaded resin-based material incorporate various forms of the material. An improved inductor device is achieved by improving the characteristics of the core material. A method to replace discrete capacitors and/or inductors for oscillator devices with capacitors and/or inductors molded into a circuit is achieved.

As shown in the preferred embodiments, the novel methods and devices of the present invention provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A LC tunable resonator device comprising:
   a capacitor comprising:
   a first plate comprising a conductive loaded, resin-based material comprising conductive materials in a base resin host; and
   a second plate fixably held nearby but not contacting said first plate such that said first plate and said second plate are capacitively coupled; and
   an inductor comprising a loop of said conductive loaded, resin-based material wherein at least one of said capacitor and said inductor have a varying value.

2. The device according to claim 1 wherein a ratio, by weight, of said conductive materials to said resin host is between about 0.20 and about 0.40.

3. The device according to claim 1 wherein said conductive materials comprise metal powder.

4. The device according to claim 3 wherein said metal powder is nickel, copper, or silver.

5. The device according to claim 3 wherein said metal powder is a non-conductive material with a metal plating.

6. The device according to claim 5 wherein said metal plating is nickel, copper, silver, or alloys thereof.

7. The device according to claim 3 wherein said metal powder comprises a diameter of between about 3 µm and about 12 µm.

8. The device according to claim 1 wherein said conductive materials comprise non-metal powder.

9. The device according to claim 8 wherein said non-metal powder is carbon, graphite, or an amine-based material.

10. The device according to claim 1 wherein said conductive materials comprise a combination of metal powder and non-metal powder.

11. The device according to claim 1 wherein said conductive materials comprise micron conductive fiber.

12. The device according to claim 11 wherein said micron conductive fiber is nickel plated carbon fiber, stainless steel fiber, copper fiber, silver fiber or combinations thereof.

13. The device according to claim 11 wherein said micron conductive fiber has a diameter of between about 3 µm and about 12 µm and a length of between about 2 mm and about 14 mm.

14. The device according to claim 1 wherein said conductive materials comprise a combination of conductive powder and conductive fiber.

15. The device according to claim 1 further comprising an antenna coupled to said capacitor and said inductor.

16. The device according to claim 1 wherein said capacitor is variable and wherein said first plate and said second plate are movably related such that an overlap area of said first plate and said second plate can be varied.

17. The device according to claim 16 wherein said second plate comprises metal.

18. The device according to claim 16 wherein said second plate comprises said conductive loaded resin-based material.

19. The device according to claim 16 wherein said first plate and said second plate comprise multiple material planes that are interlaced to increase parallel surfaces therebetween.

20. The device according to claim 16 wherein one of said first and second plates further comprises a circuit trace on a molded circuit board.

21. The device according to claim 16 wherein one of said first and second plates further comprises a part of a molded housing for an electrical device.

22. The device according to claim 1 wherein said inductor is variable and further comprises a core structure located inside said loop wherein said core structure alters the inductance of said loop and wherein said core structure and said loop are held in a movable relationship.

23. The device according to claim 22 further comprising an electrically insulating layer surrounding said loop.

24. The device according to claim 23 wherein said electrically insulating layer is a resin-based material.

25. The device according to claim 22 wherein said core structure comprises conductive loaded resin-based material.

26. The device according to claim 22 wherein said conductive loaded resin-based material comprises an iron-based conductive load.

27. The device according to claim 22 wherein said core structure comprises a metal.

28. The device according to claim 22 wherein said loop comprises multiple turns of said conductive loaded resin-based material.

29. The device according to claim 1 wherein said inductor is variable and further comprises multiple terminals corresponding to multiple inductance values for said inductor based on selection of said multiple terminals.

30. A LC tunable resonator device comprising:
   a capacitor comprising:
   a first plate comprising a conductive loaded, resin-based material comprising conductive materials in a base resin host; and
   a second plate fixably held nearby but not contacting said first plate such that said first plate and said second plate are capacitively coupled;
   an inductor comprising a loop of said conductive loaded, resin-based material wherein at least one of said capacitor and said inductor have a varying value; and
   an antenna coupled to said capacitor and said inductor.

31. The device according to claim 30 wherein a ratio, by weight, of said conductive materials to said resin host is between about 0.20 and about 0.40.

32. The device according to claim 30 wherein said conductive materials comprise metal powder.

33. The device according to claim 32 wherein said metal powder is a non-conductive material with a metal plating.

34. The device according to claim 30 wherein said conductive materials comprise non-metal powder.

35. The device according to claim 30 wherein said conductive materials comprise a combination of metal powder and non-metal powder.

36. The device according to claim 30 wherein said conductive materials comprise micron conductive fiber.

37. The device according to claim 30 wherein said conductive materials comprise a combination of conductive powder and conductive fiber.

38. The device according to claim 30 wherein said capacitor is variable and wherein said first plate and said second plate are movably related such that an overlap area of said first plate and said second plate can be varied.

39. The device according to claim 38 wherein said second plate comprises metal.

40. The device according to claim 38 wherein said second plate comprises said conductive loaded resin-based material.

41. The device according to claim 38 wherein said first plate and said second plate comprise multiple material planes that are interlaced to increase parallel surfaces therebetween.

42. The device according to claim 38 wherein one of said first and second plates further comprises a circuit trace on a molded circuit board.

43. The device according to claim 38 wherein one of said first and second plates further comprises a part of a molded housing for an electrical device.

44. The device according to claim 30 wherein said inductor is variable and further comprises a core structure located inside said loop wherein said core structure alters the inductance of said loop and wherein said core structure and said loop are held in a movable relationship.

45. The device according to claim 44 further comprising an electrically insulating layer surrounding said loop.

46. The device according to claim 45 wherein said electrically insulating layer is a resin-based material.

47. The device according to claim 44 wherein said core structure comprises conductive loaded resin-based material.

48. The device according to claim 44 wherein said conductive loaded resin-based material comprises an iron-based conductive load.

49. The device according to claim 44 wherein said core structure comprises a metal.

50. The device according to claim 44 wherein said loop comprises multiple turns of said conductive loaded resin-based material.

51. The device according to claim 30 wherein said inductor is variable and further comprises multiple terminals corresponding to multiple inductance values for said inductor based on selection of said multiple terminals.

52. A method to form a LC resonator device, said method comprising:
providing a conductive loaded, resin-based material comprising conductive materials in a resin-based host; and
molding said conductive loaded, resin-based material wherein said molding includes shaping said conductive loaded, resin-based material with a mold and curing said conductive loaded, resin-based material to thereby form an inductor or a capacitor of a LC resonator device coupling an antenna to the capacitor and the inductor.

53. The method according to claim 52 wherein a ratio, by weight, of said conductive materials to said resin host is between about 0.20 and about 0.40.

54. The method according to claim 52 wherein the conductive materials comprise a conductive powder.

55. The method according to claim 52 wherein said conductive materials comprise a micron conductive fiber.

56. The method according to claim 52 wherein said conductive materials comprise a combination of conductive powder and conductive fiber.

57. The method according to claim 52 wherein said molding comprises:
injecting said conductive loaded, resin-based material into a mold;
curing said conductive loaded, resin-based material; and
removing said device from said mold.

58. The method according to claim 57 further comprising forming a dielectric layer over said device.

59. The method according to claim 58 wherein said step of forming a dielectric layer comprises over-molding.

60. The method according to claim 58 wherein said step of forming a dielectric layer comprises dipping, spraying, or coating.

61. The method according to claim 57 further comprising forming a dielectric layer prior to said step of injecting said conductive loaded, resin-based material into a mold wherein said device is over-molded onto said dielectric layer.

62. The method according to claim 52 wherein said molding comprises:
loading said conductive loaded, resin-based material into a chamber;
extruding said conductive loaded, resin-based material out of said chamber through a shaping outlet; and
curing said conductive loaded, resin-based material to form said device.

63. The method according to claim 62 further comprising stamping or milling said molded conductive loaded, resin-based material.

64. The method according to claim 62 further comprising forming a dielectric layer over said device.

65. The method according to claim 64 wherein said step of forming a dielectric layer comprises extrusion.

66. The method according to claim 62 wherein said step of forming a dielectric layer comprises dipping, spraying, or coating.

* * * * *